United States Patent [19]

Kaplan et al.

[11] Patent Number: 4,497,891
[45] Date of Patent: Feb. 5, 1985

[54] DRY-DEVELOPED, NEGATIVE WORKING ELECTRON RESIST SYSTEM

[75] Inventors: Leon H. Kaplan, Yorktown Heights; Richard D. Kaplan, Wappingers Falls, both of N.Y.

[73] Assignee: International Business Machines Corporation, Armonk, N.Y.

[21] Appl. No.: 545,032

[22] Filed: Oct. 25, 1983

[51] Int. Cl.$^3$ .................................... G03C 5/00
[52] U.S. Cl. ................................ 430/296; 430/323; 430/330; 430/270
[58] Field of Search ............... 430/296, 330, 323, 270

[56] References Cited

U.S. PATENT DOCUMENTS

| | | | |
|---|---|---|---|
| 4,241,165 | 12/1980 | Hughes et al. | 430/269 |
| 4,267,257 | 5/1981 | Poliniak et al. | 430/270 |
| 4,289,845 | 9/1981 | Bowden et al. | 430/296 |
| 4,307,178 | 12/1981 | Kaplan et al. | 430/296 |
| 4,398,001 | 8/1983 | Cheng et al. | 525/502 |
| 4,409,317 | 10/1983 | Shiraishi | 430/270 |
| 4,476,216 | 10/1984 | Tobias | 430/296 |

*Primary Examiner*—John E. Kittle
*Assistant Examiner*—José G. Dees
*Attorney, Agent, or Firm*—Joseph G. Walsh

[57] ABSTRACT

A process for producing a resist pattern by dry development using a resist comprising from 70 to 50% by weight of a novolac resin and from 30 to 50% by weight of a poly(ether pentene sulfone).

4 Claims, No Drawings

DRY-DEVELOPED, NEGATIVE WORKING ELECTRON RESIST SYSTEM

DESCRIPTION

Technical Field

The present invention is concerned with a process for a dry-developed, negative working electron resist system.

BACKGROUND ART

U.S. Pat. No. 4,289,845 shows resist systems comprising a novolac matrix polymer and a polysulfone modifier.

U.S. Pat. No. 4,398,001 shows the use of a novolac matrix and a sulfone additive which is a poly(ether pentene solfone) (PEPS).

Neither of these two prior art patents discloses dry development, but only wet development.

DISCLOSURE OF THE INVENTION

The process of the present invention produces a resist pattern which may then be used to etch underlying films. The process is characterized by the steps of:

(1) coating a substrate with a resist comprising from about 50 to about 70% by weight novolac resin and from about 30 to about 50% by weight of a poly(ether pentene sulfone);

(2) pattern-wise exposing said resist to electron beam radiation;

(3) baking said resist, and (4) dry developing by exposure to oxygen plasma operating in a directional mode.

The present invention has the advantage over the prior art that it is a completely dry process. Conventional wet development imposes restrictions upon the resist, for example problems concerned with adhesion to the substrate. In addition, developer solutions and facilities represent unnecessary cost factors in lithography which are eliminated by means of the present dry development process.

In carrying out the process of the present invention, the resist is first coated on a substrate, which is characteristically silicon. The coating may be carried out by any prior art method, for example spin-coating.

The resist comprises from about 70 to 50% by weight of a novolac resin, and from about 30 to 50% by weight of a poly(ether pentene sulfone). The preparation of these materials is shown in U.S. Pat. No. 4,389,001.

It must be emphasized that only the above-quoted restricted range of resist composition is capable of dry development. This unexpected finding is a key element of the present invention.

Following the coating of the resist onto the substrate, the resist may then be baked, for example for about 30 minutes at about 105° C., to obtain a film thickness of about 11,000 angstroms. The resist is then exposed with an electron beam in a patterned fashion. Following this exposure a baking is essential. This is at about 125° C. for about 30 minutes to two hours, in air on a hot plate, for example. This bake is bracketed on the high side by image spreading and, on the low side, by ineffectiveness. A latent image may be seen at this point, and, sometimes, after exposure.

The substrate is next placed in a diode configured reactive ion etch system. The etching should be carried out under conditions which maximize directionality. Low pressure, in the range of 5-10 militorr of oxygen, is desirable in order to obtain uniformity. Following the plasma treatment, an additional bake, say from 120°-130° C. for 30 minutes is helpful to remove residues. The above process produces negative images of high resolution.

The process of the present invention can be used most advantageously in a multi-layer resist approach, as shown in Example II below, wherein there is used first a layer of polysulfone, and then a silicon-containing polymer layer on top of the polysulfone layer.

EXAMPLES

Example I

A silicon wafer, unoxidized, was coated with a solution containing novolak resin (Varcum 0427) and poly(ether pentene sulfone) (30 pct of total solids) in a solvent composed of ethyl cellosolve acetate, monochlorotoluene, n-butyl acetate and xylene. The percentage of total solids in the solution was 21. The coating thickness was 1 um. The coated wafer was baked 30 minutes at 105° C. and pattern exposed by electron beam with a dose of 15 UC/CM$^2$. The wafer was then baked for 30 minutes at 125° C. After baking, the pattern became visible and its depth was measured at about 0.12 um. The wafer was then etched in a planar reactive ion etch tool under 5 um 02 pressure at 7 W total power. After 100 minutes, the resist had disappeared from all unexposed regions, leaving a negative pattern about 1200 A high. The pattern resolved fine lines and spaces down to the micron range. The wafer was then etched in a conventional RIE system, using CF$_4$ gas. Patterns were formed in the silicon to a depth of about 1500 Angstroms. The patterns resolved line sets consisting of 5 um lines with 0.5 um spaces.

Example II

A silicon wafer was coated as follows:
1.5 um polysulfone (baked 20 minutes at 210° C.)
0.1 um plasma deposited HMDS (Hexamethyldisilazane)
1 um of PEPs/novolak resist, as in Example I.

The wafer was baked at 105° C. for 30 minutes and then exposed to a patterned E-beam at 15 UC/cm$^2$. It was then baked for two hours at 125° C. after which it was etched in 02 plasma, using 10 um 02 pressure at 10 W for 100 minutes.

At this point, a negative imaged pattern was visible. The wafer was then etched in CF$_4$ to open up the plasma HMDS layer and then in 02 plasma to open up the underlying polysulfone. In this way patterns were obtained which were 1.5 um high and which resolved 2.5 um lines and spaces. This resist image was then used to etch the patterns into the substrate to a depth (in Si) of about 0.8 um.

What is claimed is:

1. A process for producing a resist pattern, said process being characterized by the steps of:
   (1) coating a substrate with a resist comprising from 70 to 50% by weight of novolac resin and from 30 to 50% by weight of a poly(ether pentene sulfone);
   (2) pattern-wise exposing said resist to an electron beam;
   (3) baking said resist, and
   (4) dry developing the system by exposure to oxygen plasma operating in a directional mode.

2. A process as claimed in claim 1 wherein the baking is at about 125° C. for from 30 to 120 minutes.

3. A process as claimed in claim 1 wherein the resist coating is also baked following the dry development.

4. A process as claimed in claim 1 wherein a multi-layer resist is employed.

* * * * *